United States Patent
Ryu

(10) Patent No.: US 7,642,839 B2
(45) Date of Patent: Jan. 5, 2010

(54) CURRENT CONSUMPTION PREVENTION APPARATUS OF A HIGH VOLTAGE GENERATOR

(75) Inventor: Je Il Ryu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 60 days.

(21) Appl. No.: 12/119,399

(22) Filed: May 12, 2008

(65) Prior Publication Data
US 2009/0167416 A1    Jul. 2, 2009

(30) Foreign Application Priority Data
Dec. 28, 2007    (KR)    ........................ 10-2007-0140150

(51) Int. Cl.
*G05F 1/10*    (2006.01)
(52) U.S. Cl. ...................................... 327/536
(58) Field of Classification Search ................. 327/535, 327/536, 537
See application file for complete search history.

(56) References Cited
U.S. PATENT DOCUMENTS 6,008,690 A * 12/1999 Takeshima et al. .......... 327/534
6,154,088 A * 11/2000 Chevallier et al. ........... 327/536
6,545,529 B2 * 4/2003 Kim ............................ 327/536
6,717,459 B2 * 4/2004 Blodgett ...................... 327/536
7,116,154 B2 * 10/2006 Guo ............................. 327/536
7,439,793 B2 * 10/2008 Lee .............................. 327/536

FOREIGN PATENT DOCUMENTS

JP        11-134892        5/1999
KR    1020050041191 A     5/2005

* cited by examiner

*Primary Examiner*—Jeffrey S Zweizig
(74) *Attorney, Agent, or Firm*—Townsend and Townsend and Crew LLP

(57) ABSTRACT

A current consumption prevention apparatus includes a first current supply unit for transferring charges from a capacitor connected to a first inverter group to a capacitor connected to a second inverter group, and a second current supply unit for transferring charges of the capacitor connected to the second inverter group to the capacitor connected to the first inverter group. The current supply units are operated complementarily.

10 Claims, 5 Drawing Sheets

CURRENT CONSUMPTION PREVENTION APPARATUS OF A HIGH VOLTAGE GENERATOR

CROSS-REFERENCES TO RELATED APPLICATIONS

The present application claims priority to Korean patent application number 10-2007-140150, filed on Dec. 28, 2007, which is incorporated by reference in its entirety.

BACKGROUND OF THE INVENTION

The present invention relates to a current consumption prevention apparatus of a high voltage generator used in semiconductor devices.

A high voltage generator increases an external voltage for operating semiconductor devices. In particular, non-volatile memory devices require a high voltage, which is 10 times greater than an external voltage for program, erase, and read operations.

The high voltage generator generates first and second clock signals, which typically have the same cycle, but at different levels. The high voltage generator supplies the signals to a charge pump to pump an external voltage, thereby generating a high voltage.

However, a problem arises because current consumption increases during the pumping process.

BRIEF SUMMARY OF THE INVENTION

The present invention is directed towards a current consumption prevention apparatus, which can minimize current consumption occurring in a high voltage generating process, and a high voltage generator including the same.

A current consumption prevention apparatus according to an aspect of the present invention includes a first current supply unit for transferring charges of a capacitor connected to a first inverter group to a capacitor connected to a second inverter group, and a second current supply unit for transferring charges of the capacitor connected to the second inverter group to the capacitor connected to the first inverter group. The current supply units are operated complementarily.

A high voltage generator according to another aspect of the present invention includes a clock driver, a charge pump, a first current supply unit and a second current supply unit. The clock driver includes a first inverter group in which N inverters are connected in series and a second inverter group in which (N+1) inverters are connected in series. The charge pump includes a first capacitor connected to the first inverter group and a second capacitor connected to the second inverter group. The first current supply unit transfers charges of the first capacitor to the second capacitor in response to an input signal of a final inverter included in the first inverter group. The second current supply unit transfers charges of the second capacitor to the first capacitor in response to an input signal of a final inverter included in the second inverter group.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
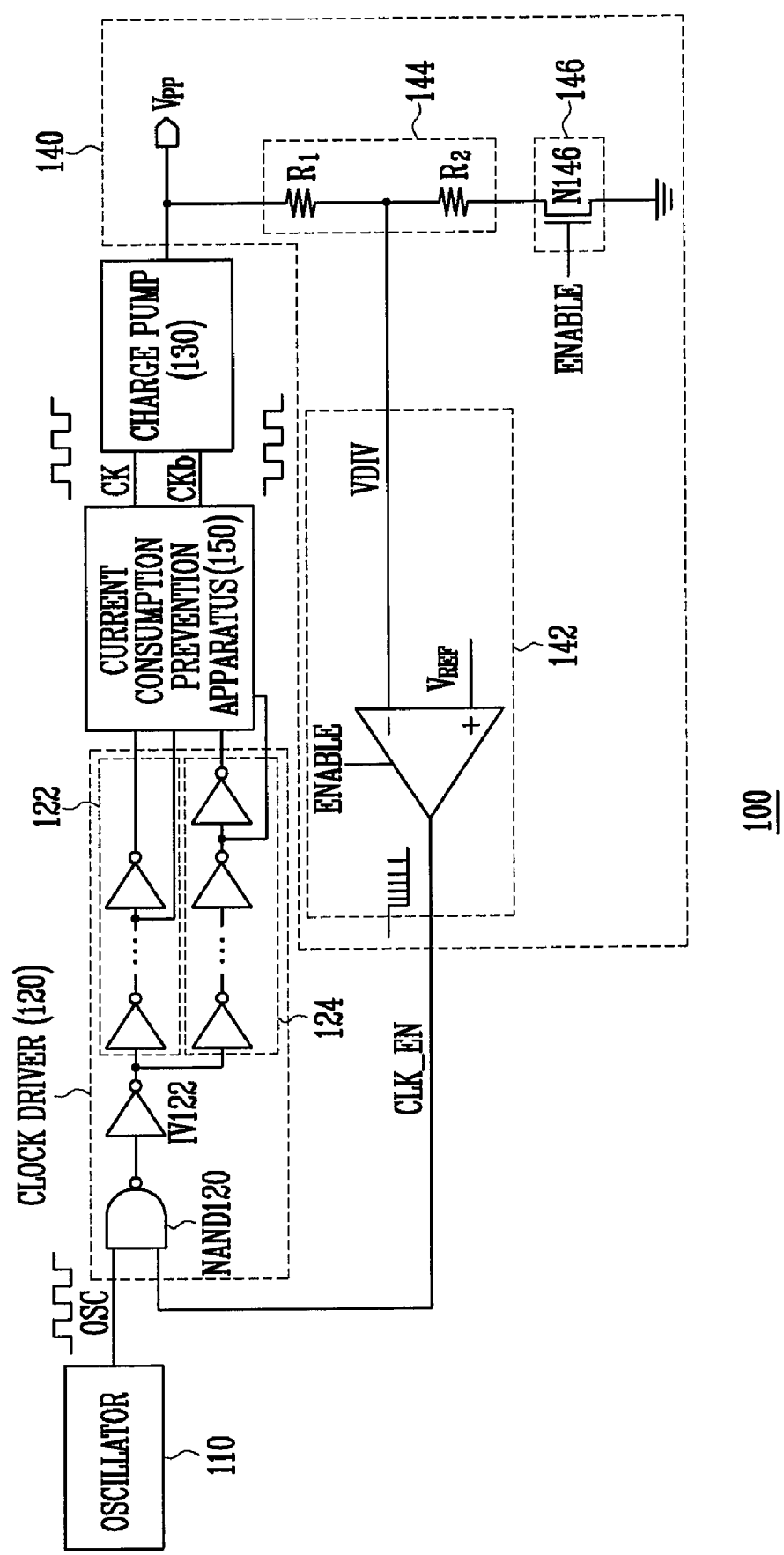
FIG. 1 is a circuit diagram showing a high voltage generator according to an embodiment of the present invention.

FIG. 1 is a circuit diagram showing a high voltage generator according to an embodiment of the present invention.

A high voltage generator 100 includes an oscillator 110, a clock driver 120, a charge pump 130, a regulator 140, and a current consumption prevention apparatus 150.

The oscillator 110 generates an oscillation signal OSC of a specific cycle and transfers the signal to the clock driver 120.

The clock driver 120 delays the oscillation signal OSC according to an output signal of a comparator 142 included in the regulator 140 and outputs two clock signals CK and CKb of different levels. The clock driver 120 includes a first inverter group 122 in which n inverters are connected in series, and a second inverter group 124 in which (n+1) inverters are connected in series.

The charge pump 130 outputs a pumping voltage VPP by performing a pumping operation according to the two clock signals CK and CKb of different levels.

The regulator 140 regulates the output voltage of the charge pump 130 to a specific voltage level. The regulator 140 includes a voltage divider 144 for dividing the output voltage of the charge pump 130 and outputting a divided voltage VDIV, a comparator 142 for controlling an operation of the clock driver 120 by comparing the divided voltage VDIV and a reference voltage VREF, and a regulator driver 146 for controlling an operation of the regulator.

The voltage divider 144 includes first and second resistors R1, R2 connected in series between the pumping voltage output terminal VPP and a ground. The voltage divider 144 outputs the divided voltage VDIV, input to the comparator 142, according to a ratio of resistances of the first and second resistors R1, R2.

The regulator driver 146 includes a NMOS transistor N146 connected between the second resistor R2 of the voltage divider 144 and the ground. The regulator driver 146 connects the voltage divider 144 and the ground in response to an enable signal ENABLE so that the regulator operates normally. The enable signal ENABLE is input to the gate of the NMOS transistor N146.

The comparator 142 compares the reference voltage VREF and the divided voltage VDIV, and outputs a clock enable signal CLK_EN of a high level to the clock driver 120 when the reference voltage VREF is higher than the divided voltage VDIV.

In order to drive constituent elements having a great load such as the charge pump, the clock driver requires a large current. In particular, in the case where the performance of a chip depends on the amount of current consumed at the time of read, program and erase operations (as in non-volatile memory devices), current consumption needs to be minimized.

For this purpose, the current consumption prevention apparatus 150 is added.

A case where current consumption is generated in the clock driver is described below.

Figure 2:
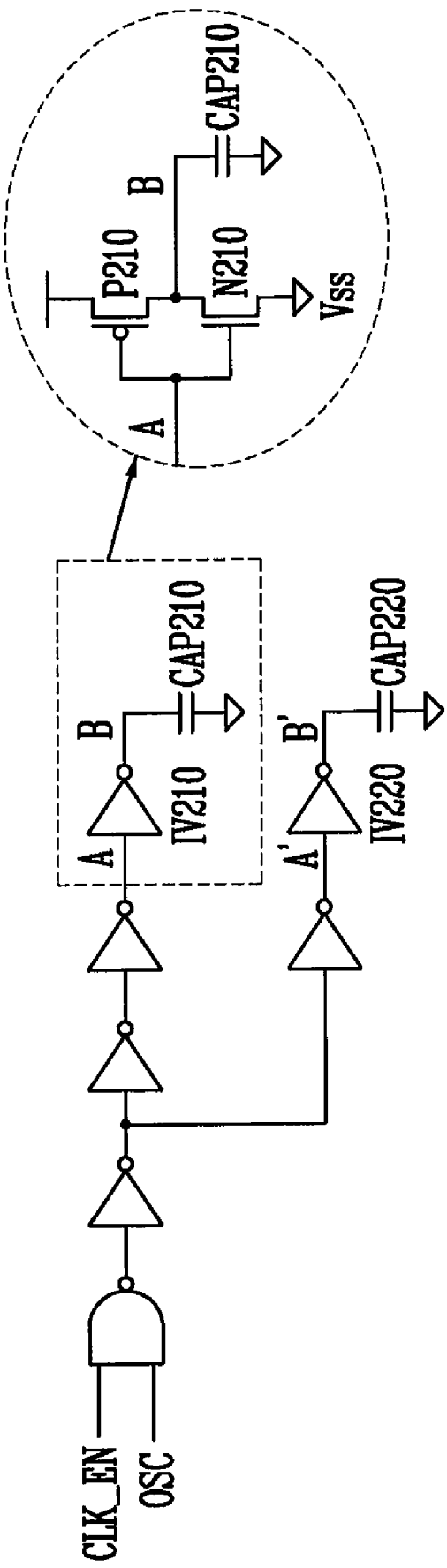
FIG. 2 is a circuit diagram showing a clock driver and a charge pump of a typical high voltage generator.
Figure 3:
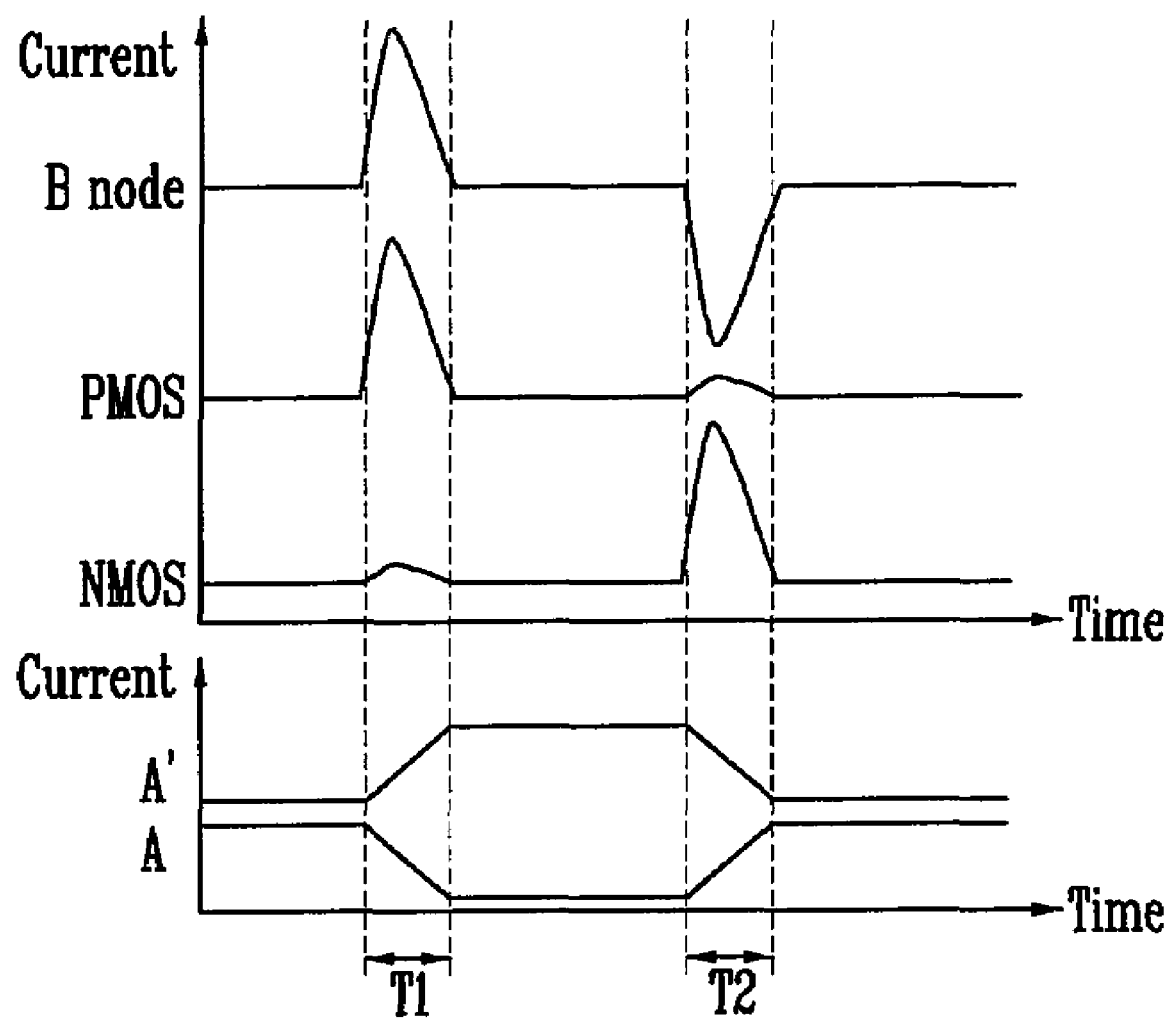
FIG. 3 is a graph illustrating a change of current consumed according to high voltage generators.

FIG. 2 is a circuit diagram showing a clock driver and a charge pump of a typical high voltage generator. FIG. 3 is a graph illustrating a change of current consumed according to high voltage generators.

FIG. 2 is a circuit diagram showing a case where there is no current consumption prevention apparatus.

Each of inverters included in the clock driver is implemented using a CMOS inverter as indicated by a circle in FIG. 2.

That is, the inverter includes a PMOS transistor P210 and a NMOS transistor N210 that are connected in series between a power supply voltage terminal and a ground voltage terminal. The gates of the transistors are commonly connected, and a drain connection node of each transistor becomes an output terminal.

Referring to FIG. 3, in a section T1, a signal applied to an input terminal A of an inverter IV210 of a first inverter group shifts from a high level to a low level. In response thereto, the PMOS transistor P210 of the inverter is turned on, and a capacitor CAP210 is charged through the power supply voltage terminal.

Thus, current flowing through the PMOS transistor P210 is increased.

In a section T2, a high-level signal is applied to the inverter IV210 to turn on the NMOS transistor N210. The capacitor CAP210 is discharged through the ground voltage terminal.

Accordingly, current flowing through the NMOS transistor N210 is increased.

As described above, as each capacitor is discharged through the ground, the amount of current consumption when the clock driver is driven increases.

Figure 4:
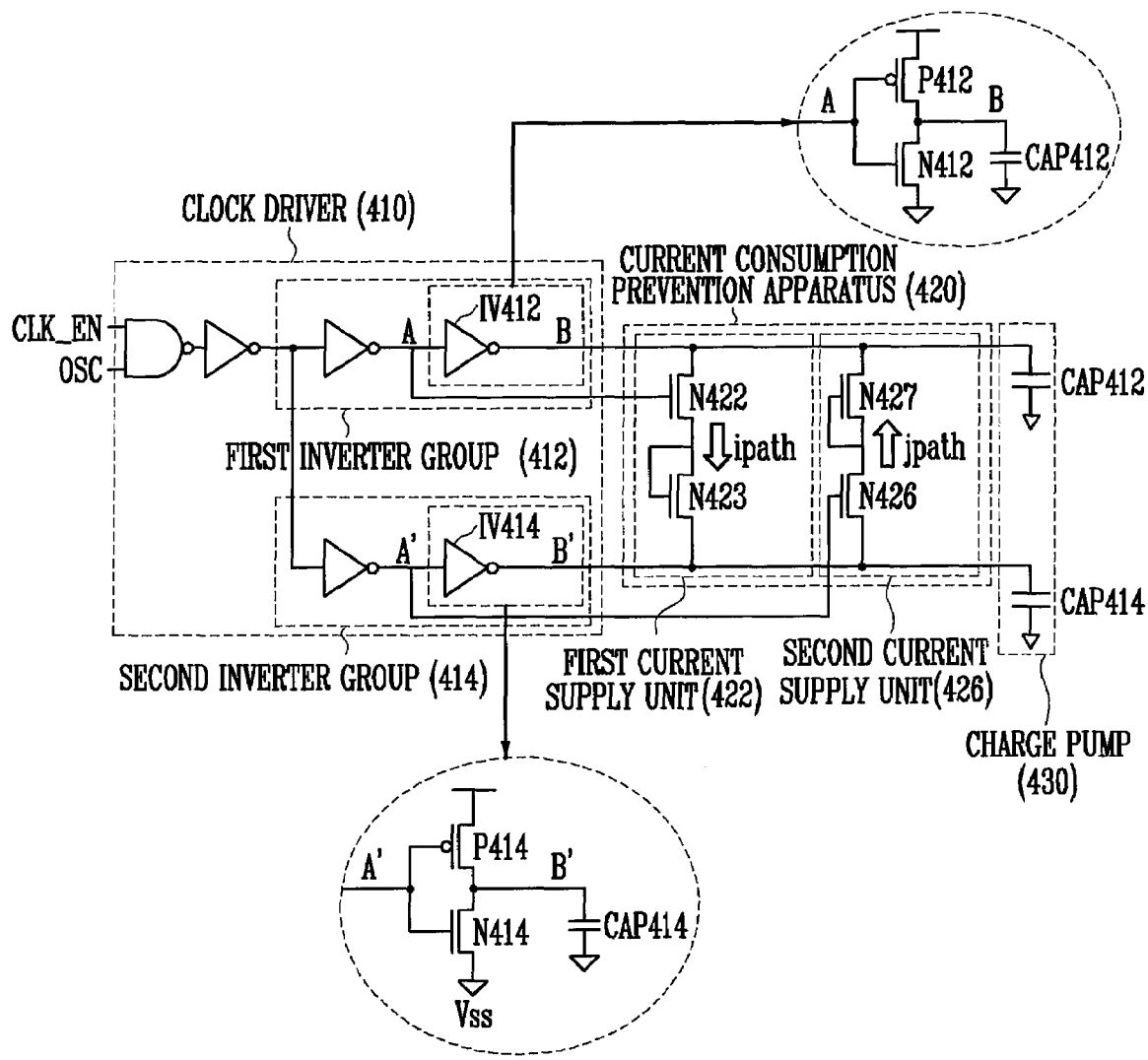
FIG. 4 is a circuit diagram showing a high voltage generator including a current consumption prevention apparatus according to an embodiment of the present invention.

FIG. 4 is a circuit diagram showing a high voltage generator including a current consumption prevention apparatus according to an embodiment of the present invention.

A clock driver 410 includes a first inverter group 412 and a second inverter group 414.

A current consumption prevention apparatus 420 is connected between the clock driver 410 and a charge pump 430.

The current consumption prevention apparatus 420 includes a first current supply unit 422 and a second current supply unit 426. The first current supply unit 422 transfers charges of a capacitor CAP412 connected to the first inverter group 412 to a capacitor CAP414 connected to the second inverter group 414. The second current supply unit 426 transfers charges of the capacitor CAP414 connected to the second inverter group 414 to the capacitor CAP412 connected to the first inverter group 412.

The first current supply unit 422 includes first and second NMOS transistors N422, N423 which are connected in series between an output terminal of the first inverter group 412 and an output terminal of the second inverter group 414. The first NMOS transistor N422 is turned on in response to an input signal of a final inverter IV412 included in the first inverter group 412. The second NMOS transistor N423 is a diode-connected transistor.

When an input signal of a high level is applied to the final inverter IV412 of the first inverter group 412, the first NMOS transistor N422 is turned on and transfers charges from the capacitor CAP412 connected to the output terminal of the first inverter group 412 to the capacitor CAP414 connected to the output terminal of the second inverter group 414.

To prevent inverse current, the second NMOS transistor N423 is diode-connected.

The second current supply unit 426 includes third and fourth NMOS transistors N426, N427 which are connected in series between the output terminal of the first inverter group 412 and the output terminal of the second inverter group 414. The third NMOS transistor N426 is turned on in response to an input signal of a final inverter IV414 included in the second inverter group 414. The fourth NMOS transistor N427 is a diode-connected transistor.

When an input signal of a high level is applied to the final inverter IV414 included in the second inverter group 414, the third NMOS transistor N426 is turned on and transfers charges of the capacitor CAP414 connected to the output terminal of the second inverter group 414 to the capacitor CAP412 connected to the output terminal of the first inverter group 412.

To prevent inverse current, the fourth NMOS transistor N427 is diode-connected.

Each of the capacitors CAP412, CAP414 has a capacitance which is substantially equivalent to a total capacitance of the capacitors included in the charge pump 430.

Signals applied to the gates of the first NMOS transistor N422 and the third NMOS transistor N426 of the first and second current supply units 422, 426 have an inverse relationship. Thus, when the first current supply unit 422 is driven, the second current supply unit 426 is not driven. That is, the first and second current supply units 422, 426 operate in a complementary fashion.

A detailed operation of the present invention is described below with reference to the drawings.

Figure 5:
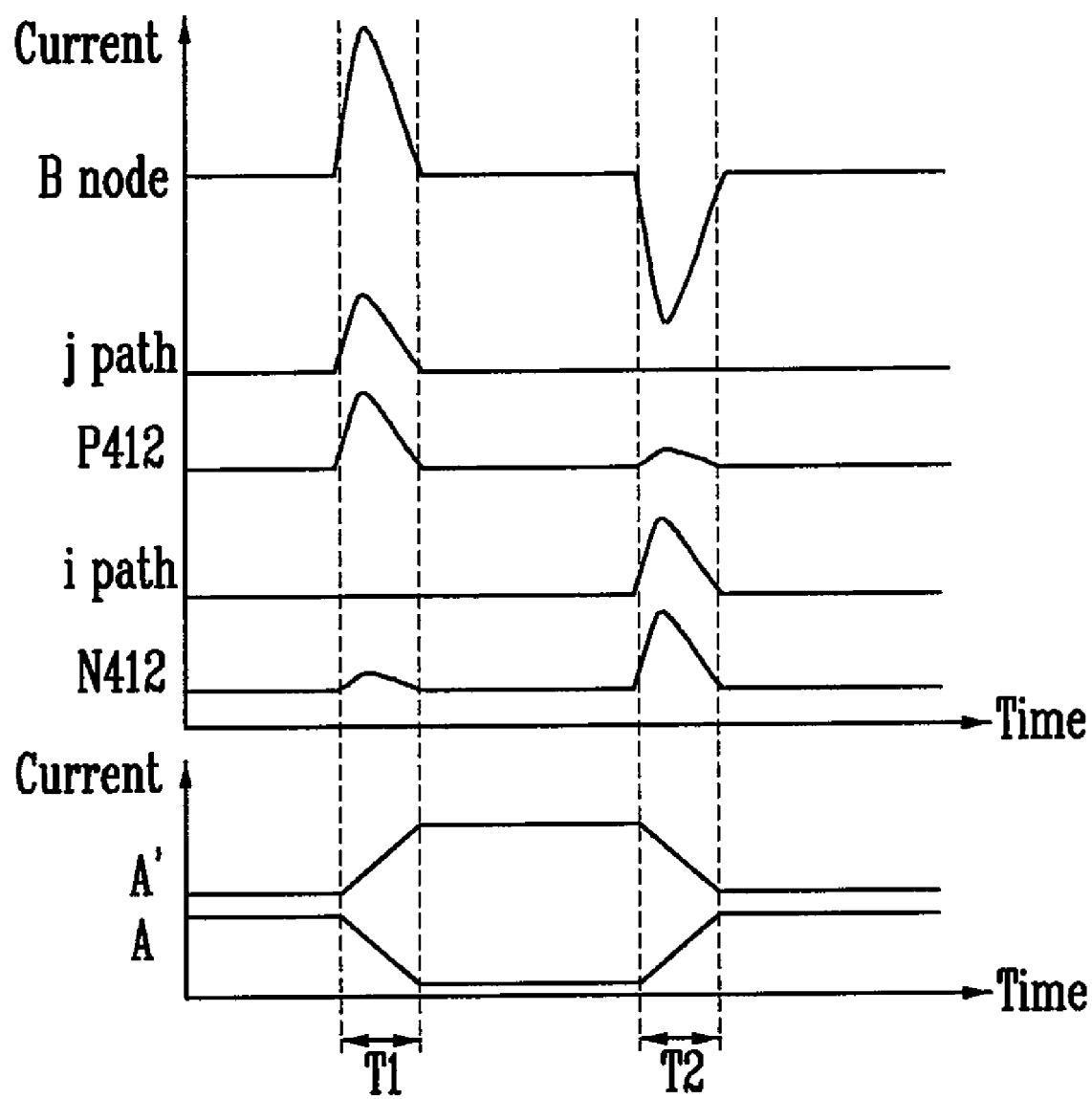
FIG. 5 is a graph illustrating current and voltage values when the current consumption prevention apparatus is operated according to an embodiment of the present invention.

FIG. 5 is a graph illustrating current and voltage values when the current consumption prevention apparatus is operated according to an embodiment of the present invention.

(1) Section T1

A signal applied to an input terminal A of the inverter IV412 of the first inverter group 412 shifts from a high level to a low level. In response thereto, a PMOS transistor P412 of the inverter IV412 is turned on, and the capacitor CAP412 is charged through the power supply voltage terminal.

Accordingly, current flowing through the PMOS transistor P412 is increased.

A signal applied to an input terminal A' of the inverter IV414 of the second inverter group 414 is complementary to a signal applied to the input terminal A and, therefore, shifts from a low level to a high level. The third NMOS transistor N426 of the second current supply unit 426 is turned on, and the capacitor CAP412 is charged by the capacitor CAP414 which is connected to the output terminal of the second inverter group.

Conventionally, charges supplied through the second current supply unit 426 are discharged through the ground. However, in the present invention, charges supplied through the second current supply unit 426 are used to charge other capacitors. Accordingly, a total consumption current can be reduced.

That is, the capacitor CAP412 can be charged not only through the PMOS transistor P412, but also through the second current supply unit 426. Thus, it can be seen that an active current directly supplied from the power supply voltage terminal is reduced by half when compared with that of FIG. 3.

(2) Section T2

A signal applied to the input terminal A of the inverter IV412 of the first inverter group 412 shifts from a low level to a high level. In response thereto, the NMOS transistor N412 of the inverter IV412 is turned on, and the capacitor CAP412 is discharged through the ground terminal.

Thus, current flowing through the NMOS transistor N412 is increased.

Further, the first NMOS transistor N422 of the first current supply unit 420 is turned on to drive the first current supply unit 422.

A signal applied to the input terminal A' of the inverter IV414 of the second inverter group shifts from a high level to a low level. Accordingly, the PMOS transistor P414 of the inverter is turned on, and the capacitor CAP414 is charged through the power supply voltage terminal.

Thus, current flowing through the PMOS transistor P414 is increased.

However, unlike the prior art, the first current supply unit 422 is driven, and charges of the capacitor CAP412 are supplied to the capacitor CAP414.

Charges supplied through the first current supply unit 422 are discharged through the ground in the prior art. However, in the present invention, the charges are used to charge other capacitors. Accordingly, a total consumption current can be reduced.

That is, the capacitor CAP414 can be charged not only through the PMOS transistor P414, but also through the first current supply unit 422. Accordingly, an active current directly supplied from the power supply voltage terminal can be reduced by half.

As described above, according to the present invention, charges of the capacitor of the charge pump are not discharged, but are used to charge other capacitors. Accordingly, an active current directly flowing from the power supply voltage terminal to the ground terminal can be reduced and, therefore, current consumed when a high voltage generator is driven can be reduced.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A current consumption prevention apparatus, comprising:
    a first current supply unit for transferring charges of a capacitor connected to a first inverter group to a capacitor connected to a second inverter group; and
    a second current supply unit for transferring charges of the capacitor connected to the second inverter group to the capacitor connected to the first inverter group,
    wherein the first and second current supply units are operated complementarily.

2. The current consumption prevention apparatus of claim 1, wherein the first current supply unit includes first and second NMOS transistors connected in series between an output terminal of the first inverter group and an output terminal of the second inverter group, the first NMOS transistor being turned on in response to an input signal of a final inverter included in the first inverter group, and the second NMOS transistor being diode-connected.

3. The current consumption prevention apparatus of claim 1, wherein the second current supply unit includes third and fourth NMOS transistors connected in series between an output terminal of the first inverter group and an output terminal of the second inverter group, the third NMOS transistor being turned on in response to an input signal of a final inverter included in the second inverter group, and the fourth NMOS transistor being diode-connected.

4. The current consumption prevention apparatus of claim 1, wherein the first current supply unit is driven when a signal of a high level is input to a final inverter included in the first inverter group.

5. The current consumption prevention apparatus of claim 1, wherein the second current supply unit is driven when a signal of a high level is input to a final inverter included in the second inverter group.

6. A high voltage generator, comprising:
    a clock driver comprising a first inverter group in which N inverters are connected in series and a second inverter group in which (N+1) inverters are connected in series;
    a charge pump comprising a first capacitor connected to the first inverter group and a second capacitor connected to the second inverter group;
    a first current supply unit for transferring charges of the first capacitor to the second capacitor in response to an input signal of a first final inverter included in the first inverter group; and
    a second current supply unit for transferring charges of the second capacitor to the first capacitor in response to an input signal of a second final inverter included in the second inverter group.

7. The high voltage generator of claim 6, wherein the first current supply unit includes first and second NMOS transistors connected in series between an output terminal of the first inverter group and an output terminal of the second inverter group, the first NMOS transistor being turned on in response to an input signal of the first final inverter, and the second NMOS transistor being diode-connected.

8. The high voltage generator of claim 6, wherein the second current supply unit includes third and fourth NMOS transistors connected in series between an output terminal of the first inverter group and an output terminal of the second inverter group, the third NMOS transistor being turned on in response to an input signal of the second final inverter, and the fourth NMOS transistor being diode-connected.

9. The high voltage generator of claim 6, wherein:
    when a signal of a high level is input to the first final inverter, the first current supply unit transfers charges of the first capacitor to the second capacitor, and
    the second final inverter charges the second capacitor.

10. The high voltage generator of claim 6, wherein:
    when a signal of a low level is input to the first final inverter, the second current supply unit transfers charges of the second capacitor to the first capacitor, and
    the first final inverter charges the first capacitor.

* * * * *